(12) United States Patent
Su

(10) Patent No.: US 9,072,179 B2
(45) Date of Patent: *Jun. 30, 2015

(54) DISPLAY DEVICE

(71) Applicant: Qisda Corporation, Taoyuan County (TW)

(72) Inventor: Yung-Chun Su, New Taipei (TW)

(73) Assignee: Qisda Corporation, Taoyuan County (TW)

(*) Notice: Subject to any disclaimer, the term of this patent is extended or adjusted under 35 U.S.C. 154(b) by 0 days.

This patent is subject to a terminal disclaimer.

(21) Appl. No.: 14/334,667

(22) Filed: Jul. 18, 2014

(65) Prior Publication Data

US 2014/0328040 A1   Nov. 6, 2014

Related U.S. Application Data

(62) Division of application No. 13/106,025, filed on May 12, 2011, now Pat. No. 8,922,995.

(30) Foreign Application Priority Data

May 14, 2010  (TW) ................. 99115448 A

(51) Int. Cl.
| | |
|---|---|
| G06F 1/16 | (2006.01) |
| H05K 5/02 | (2006.01) |
| F16M 11/10 | (2006.01) |
| F16M 13/00 | (2006.01) |
| H05K 5/00 | (2006.01) |

(52) U.S. Cl.
CPC ............ *H05K 5/0234* (2013.01); *F16M 11/10* (2013.01); *F16M 13/005* (2013.01); *F16M 2200/022* (2013.01); *H05K 5/0017* (2013.01); *H05K 5/0217* (2013.01); *Y10S 248/917* (2013.01); *Y10S 248/918* (2013.01); *Y10S 248/919* (2013.01)

(58) Field of Classification Search
CPC ......... G06F 1/166; F16M 11/06; F16M 11/10
USPC ............ 361/679.01–679.45, 679.55–679.59; 248/917–924; 40/749, 750, 748, 755, 40/756, 754
See application file for complete search history.

(56) References Cited

U.S. PATENT DOCUMENTS

| | | | |
|---|---|---|---|
| 6,532,628 B2* | 3/2003 | Kim .............................. 16/342 |
| 6,570,627 B1* | 5/2003 | Chang .......................... 348/794 |
| 7,236,354 B2* | 6/2007 | Hsu et al. ................. 361/679.07 |
| 7,391,606 B2* | 6/2008 | Chen et al. ............... 361/679.27 |
| 7,540,466 B2* | 6/2009 | Yang .............................. 248/688 |
| 7,762,519 B2* | 7/2010 | Kunii et al. .................... 248/688 |
| 7,841,575 B1* | 11/2010 | Sliger ............................ 248/454 |
| 8,201,687 B2* | 6/2012 | Zeliff et al. ................... 206/320 |
| 8,534,635 B2* | 9/2013 | Yang et al. .................... 248/458 |
| 2005/0097797 A1* | 5/2005 | Wang et al. ..................... 40/610 |
| 2005/0269479 A1* | 12/2005 | Yeh et al. ....................... 248/457 |
| 2010/0067184 A1* | 3/2010 | Liou et al. ................ 361/679.21 |

* cited by examiner

*Primary Examiner* — Nidhi Thaker

(57) ABSTRACT

A display device includes a body, a support, and a first elastic unit. The support is rotatably disposed on a back side of the body and has a first slip stopper. The first elastic unit is pivotally connected to the body and the support. The display device is supported on the a working surface by a bottom of the body and the first slip stopper. The first elastic unit generates an elastic force to pull the support toward the body when the first slip stopper moves away from the working surface.

13 Claims, 11 Drawing Sheets

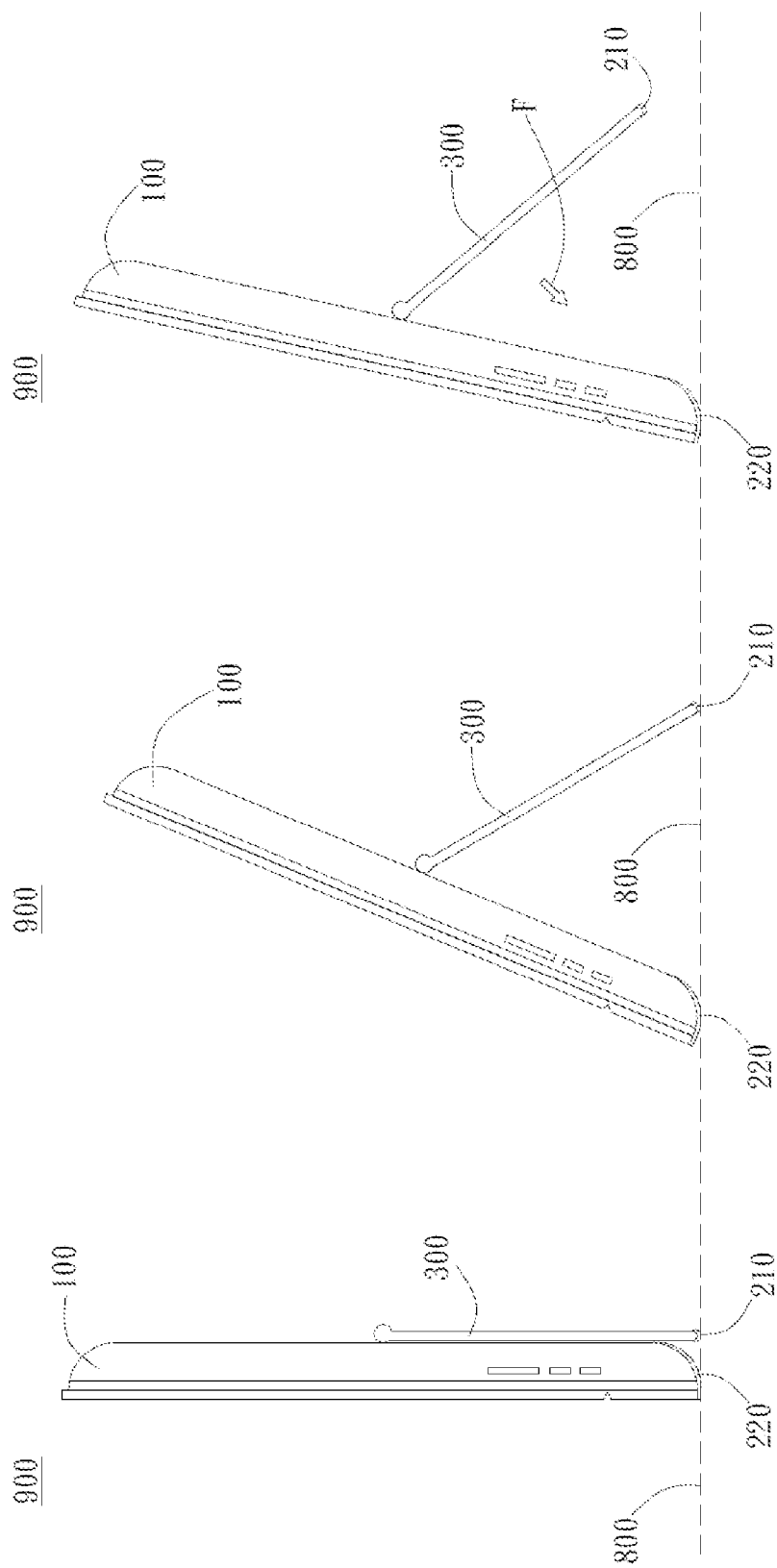

DISPLAY DEVICE

BACKGROUND OF THE INVENTION

1. Field of the Invention

This invention provides a display device having an automatic foldable support, increasing the convenience of use.

2. Description of the Prior Art

Displays are widely used in modern life. In addition to being a necessary output equipment of a computer, the displays can be used for receiving and displaying television programs, video games, and multimedia information.

Human eyes are receivers of video images output by the display. In order to have the greatest displaying effect and to avoid the discomfort and vision loss caused by users lifting up and down their heads for a long period of time, the height of the display is preferably adjustable. Moreover, the height of the display is preferably easily adjustable since the user frequently changes the position and the elevation angle of his/her head.

At present, the conventional mechanism for adjusting the tilt angle of the display device includes two supports adjacent to each other and operating in coordination with a pressing spring. After the display device is adjusted, the above-mentioned mechanism uses the pressing spring to increase friction between the two coaxially rotatable supports in order to maintain the adjusted tilt angle. However, the use of pressing spring in the conventional technology increases the production cost and the material cost. On the other hand, the pressing spring is also subject to the risk of fracture if the heat treatment is improper. Therefore, there is still room for improvement in convenience and economy of the support used in displays.

SUMMARY OF THE INVENTION

It is an objective of the present invention to provide a display device which is easier and more convenient to use on a working surface.

It is another objective of the present invention to provide a display device to be used on a working surface and reduce the associated production cost.

The display device of the present invention includes a body, a support, and a first elastic unit. The support is rotatably disposed on the back side of the body and has a first slip stopper. The first elastic unit is pivotally connected to the body and the support. The display device is supported on the working surface by the bottom of the body and the first slip stopper. The first elastic unit generates an elastic force to pull the support toward the body when the first slip stopper moves away from the working surface. The body further includes a second slip stopper disposed on the bottom of the body.

The support further includes a first pivot and a first connector, wherein the first elastic unit is pivotally connected to the first pivot and the first connector. The first connector is fixed on the back side of the body.

An end portion of the first connector is disposed corresponding to the first pivot and has a curved portion, wherein the first pivot has a bump. The curved portion limits the displacement of the bump when the first pivot rotates.

An end portion of the first connector is disposed corresponding to the first pivot and has a bump. The first pivot has a curved portion. The curved portion limits the displacement of the bump when the first pivot rotates.

An end portion of the first connector is disposed corresponding to the first pivot and the first connector has a first positioning point. The first pivot has a second positioning point, wherein the support and the body are parallel with each other in a storage state when the first positioning point contacts the second positioning point.

The display device further includes a second elastic unit and the support further includes a second pivot and a second connector. The second elastic unit is pivotally connected to the second pivot and the second connector. The second connector is fixed on the back side of the body, wherein the first elastic unit and the second elastic unit together generate an elastic force to pull the support toward the body when the first slip stopper moves away from the working surface. The support is a U-shaped support, wherein the first pivot and the first connector are disposed at one end of the U-shaped support while the second pivot and the second connector are disposed at the other end of the U-shaped support.

The display device further includes an extending support disposed on the back side of the body opposite to the support and inrotatable with respect to the support, wherein an angle is included between the extending support and the support. A first angle is included between the body and the support when the body and the support are supported on the working surface. A second angle is included between the body and the extending support when the body and the extending support are supported on the working surface. The second angle is greater than the first angle.

The display device further includes an extending support and a third elastic unit. The extending support is rotatably disposed on the back side of the body and a third slip stopper is disposed at the bottom of the extending support. The third elastic unit is pivotally connected to the body and the extending support, wherein the display device is supported on the working surface by the bottom of the body and the third slip stopper. The third elastic unit generates an elastic force to pull the extending support toward the body when the third slip stopper moves away from the working surface. An angle is included between the body and the support when the display device is supported on the working surface by the bottom of the body and the first slip stopper, wherein the angle is between 60° and 130°.

BRIEF DESCRIPTION OF THE DRAWINGS

FIGS. 2A to 2E are schematic views showing different operation states of the display device of one preferred embodiment of the present invention;

DETAILED DESCRIPTION OF THE PREFERRED EMBODIMENT

The present invention provides a display device to be used on a working surface. The display device is preferably an electronic device having a touch screen such as a tablet computer or an electronic book. However, in different embodiments, the display device can also be other electronic devices with image-displaying function, such as personal computer monitors, plasma televisions, liquid crystal televisions, and digital frames. The working surface refers to a surface on which the display device can be placed and operated, such as a desktop or the top of a shelf.

Figure 1:
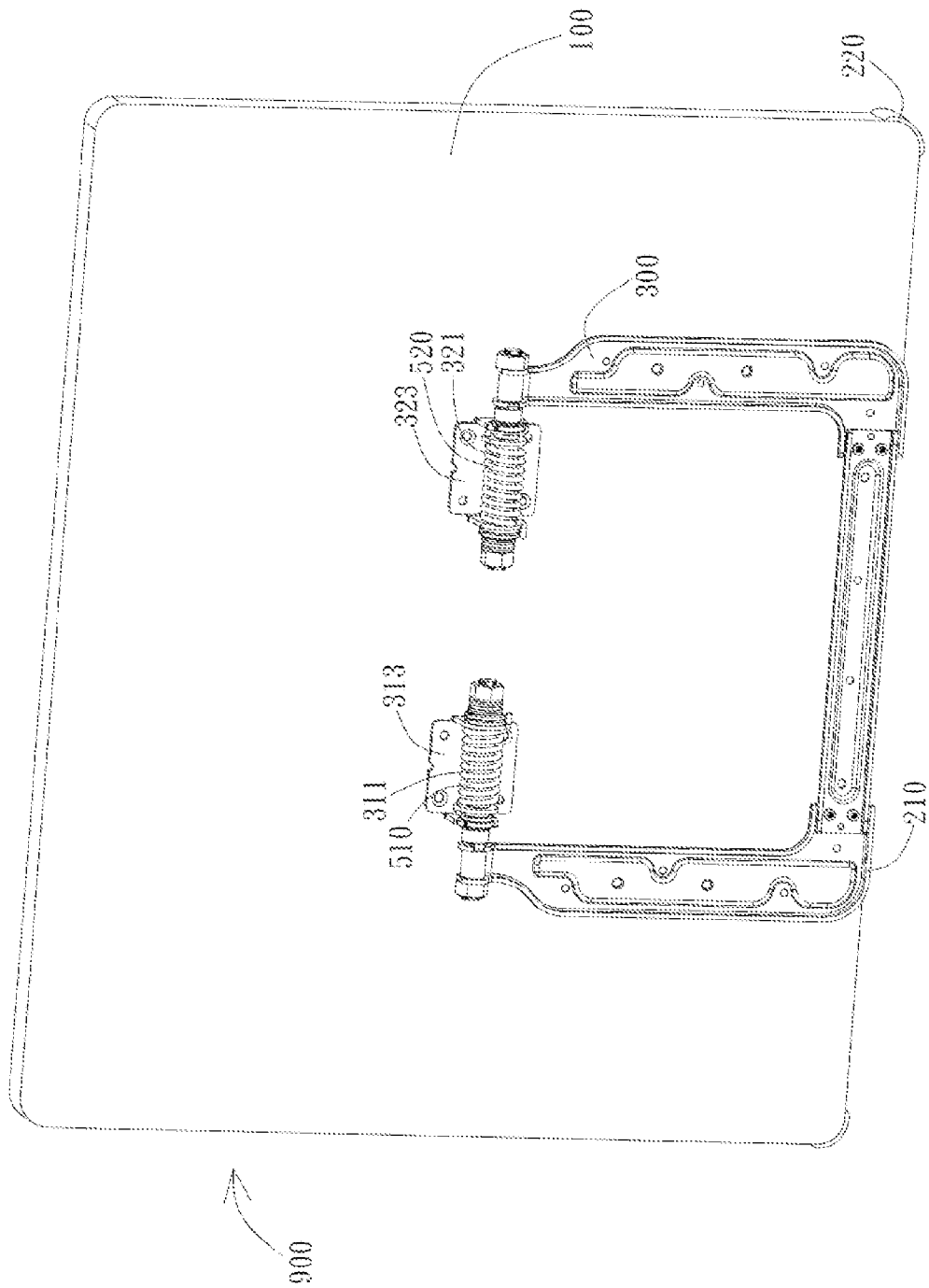
FIG. 1 is a schematic view of the display device in one embodiment of the present invention.

In the embodiment illustrated in FIG. 1, the display device 900 of the present invention includes a body 100, a support 300, and a first elastic unit 510. The support 300 is rotatably disposed on the back side of the body 100 and has a first slip stopper 210. The first slip stopper 210 is a high friction material such as glue strip and is preferably disposed on one end of the support 300 near the bottom of the body 100. The first elastic device 510 is pivotally connected to the body 100 and the support 300. The display device 900 is supported on the working surface 800 by the bottom of the body 100 and the first slip stopper 210 (here please refer to FIG. 2B). The first elastic unit 510 generates an elastic restoring force to pull the support 300 toward the body 100 when the first slip stopper 210 moves away from the working surface 800. Specifically, two ends of the first elastic unit 510 are connected to the body 100 and the support 300, respectively. Therefore, the first elastic unit 510 deforms to generate a restoring force to pull the support 300 toward the body 100 when one end of the support 300 disposed with the first slip stopper 210 moves away from the working surface 800.

As shown in the operation states of the preferred embodiment of FIGS. 2A to 2C, one end of the support 300 disposed with the first slip stopper 210 can rotatably move away from the back side of the body 100, so that the display device 900 can transform from the storage state (e.g. folded state) illustrated in FIG. 2A to the working state (e.g. expanded state) illustrated in FIG. 2B, wherein the angle between the body 100 and the support 300 is preferably between 60° and 130° in the working state. By means of friction forces generated between the first slip stopper 210 and the working surface 800 as well as between the bottom of the body 100 and the working surface 800, the support 300 can support the body 100 and maintain the display device 900 in a desired position on the working surface 800. The body 100 can further include a second slip stopper 220 disposed on the bottom of the body 100 to increase the friction generated between the bottom of the body 100 and the working surface 800. On the other hand, when the user is finished using the display device 900 and wishes to put the display device 900 in storage, the user can move the first slip stopper 210 away from the working surface 800 by slightly lifting the body 100, as illustrated in FIG. 2C. At this moment, the first elastic unit 510 will generate an elastic force to pull the support 300 toward the body 100, so that the display device 900 returns back to the storage state as illustrated in FIG. 2A.

Figure 2D:
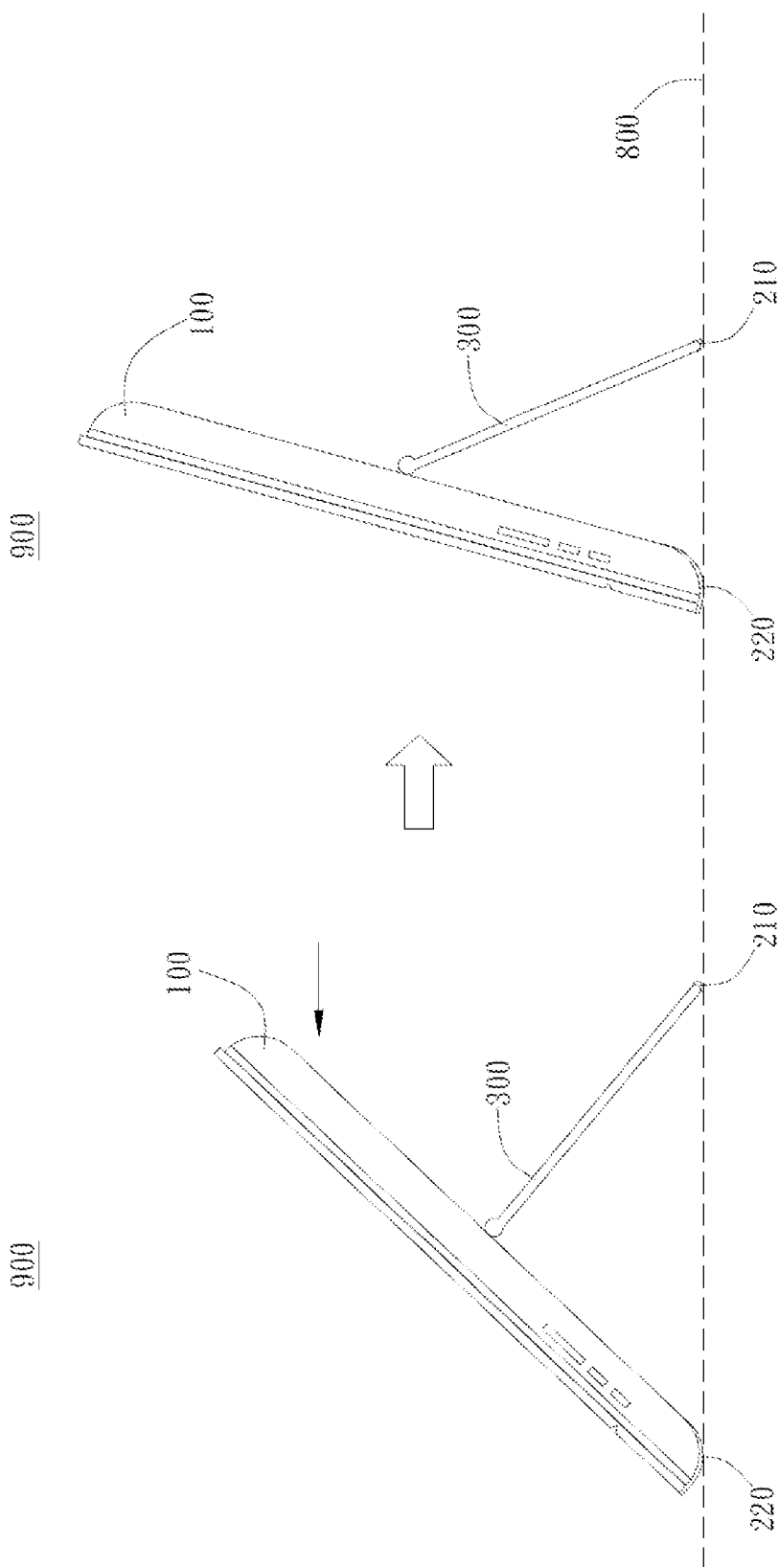

In other words, if the user wishes to adjust the angle between the display device 900 and the working surface 800 as illustrated in FIG. 2D, and if the user wishes to adjust the display device 900 from a greater viewing angle to a smaller viewing angle, he or she only needs to push the body 100 in a direction indicated by the arrow illustrated in FIG. 2D, i.e. push the upper portion of the body 100 from the back side. If the user wishes to adjust the viewing angle of the display device 900 from a smaller viewing angle to a greater viewing angle, he or she only needs to push the body 100 in a direction indicated by the arrow illustrated in FIG. 2E, i.e. push the lower portion of the body 100 from the back side. Compared with the conventional technology which needs to first lift up the display device 900, adjust the support 300 to a proper position, and then put the display device 900 back on the working surface 800, the present invention is easier to use or manipulate. At the same time, the structure of the present invention does not need to install pressing springs at two supports adjacent to each other and thus reduces the production cost. On the other hand, the restoring force generated by the first elastic device 510 increases as the deformation of the first elastic device 510 increases. That is, the restoring force increases as the distance between the support 300 and the back side of the body 100 increases, i.e. as the support 300 moves further away from the body 100. If the user wishes to position the display device 900 at a greater viewing angle, i.e. when the support 300 is very distant from the body 100, he or she only needs to slightly lift the display device 900 and then the support 300 will automatically move toward the body 100 due to the elastic force. At this moment, the friction provided by the first slip stopper 210 that still contacts the working surface 800 can buffer the elastic force of the first elastic unit 510. In this way, the support 300 will not abruptly move toward the body 100 due to the elastic force of the first elastic unit 510 and thus will not damage the body 100 or injure the user.

In the preferred embodiment illustrated in FIG. 1, the support 300 further includes a first pivot 311 and a first connector 313. The first elastic unit 510 is pivotally connected to the first pivot 311 and the first connector 313 is fixed on the back side of the body 100. The first pivot 311 passes through the first elastic unit 510 and two ends of the first elastic unit 510 are connected to the first pivot 311 and the first connector 313, respectively. The first connector 313 is preferably a plate. In other words, the support 300 can be disposed on the back side of the body 100 using the first connector 313. The support 300 can rotate with respect to the first connector 313, and therefore the support 300 can rotate with respect to the back side of the body 100 after the first connector 313 is fixed on the back side of the body 100. In this way, during production processes, the support 300 can be produced first and then disposed on different body 100. That is, different bodies 100 such as tablet computers, electronic books, or liquid crystal displays can use the same support 300 and thus the associated production costs can be reduced.

Figure 3A:
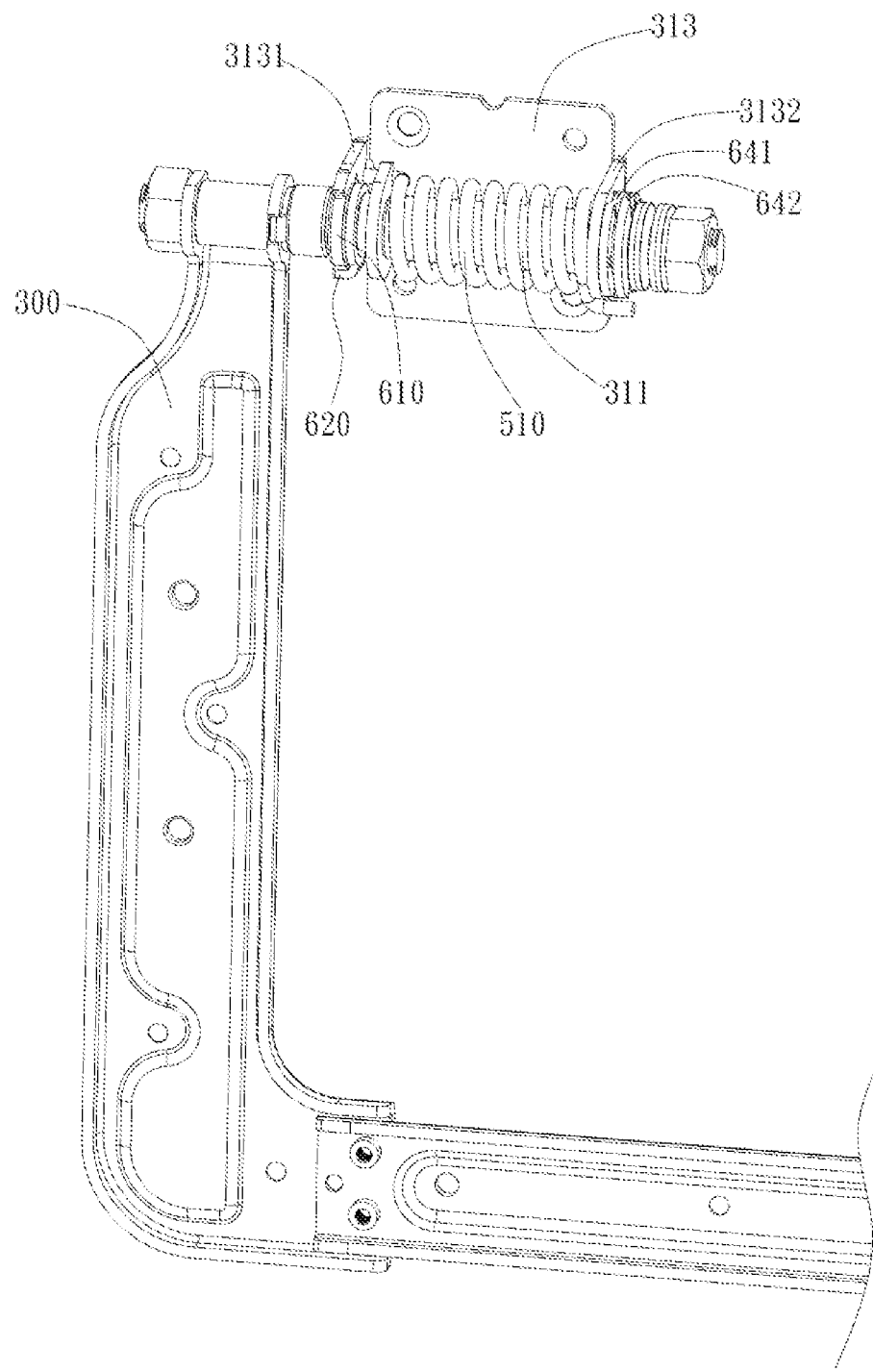
FIG. 3A and FIG. 3B are schematic views of the display device having a curved portion and a bump in one embodiment of the present invention.

As FIG. 3A shows, in a more preferred embodiment, a first end portion 3131 of the first connector 313 has a curved portion 610 and the first pivot 311 passes through the first end portion 3131 of the first connector 313, wherein the first pivot 311 has a bump 620 corresponding to the curved portion 610. Specifically, the curved portion 610 is a curved groove formed at the edge of the first end portion 3131 while the bump 620 extends into the curved groove. The curved portion 610 limits the displacement of the bump 620 when the first pivot 311 rotates. The support 300 is linked to the first pivot 311 and this design limits the range of rotation of the support 300 relative to the first connector 313, i.e. limits the angle of rotation of the support 300 relative to the body 100 and prevents the occurrence of elastic fatigue in the first elastic 510 caused by an excessive turning angle of the support 300.

Figure 3B:
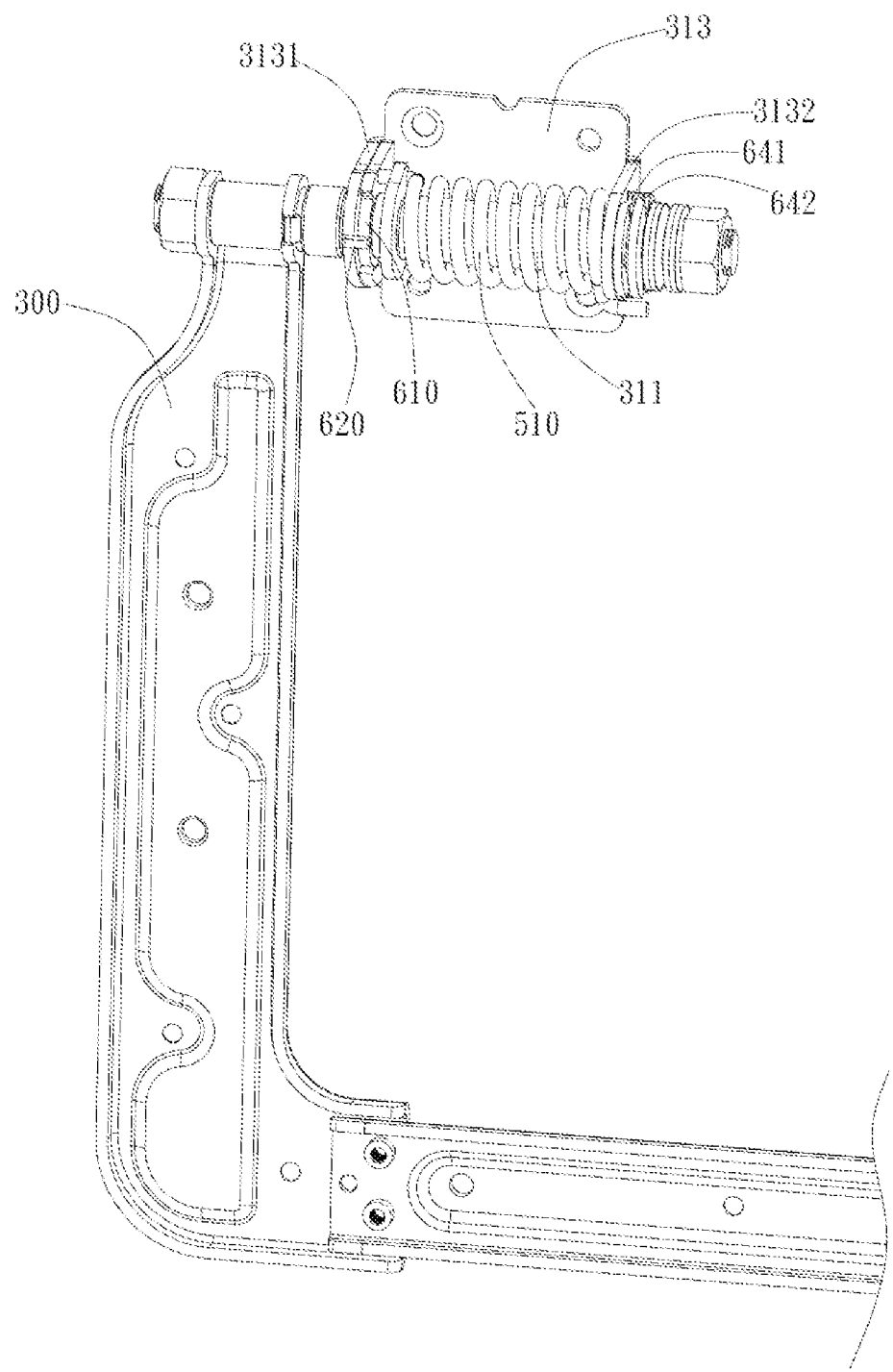

In different embodiments, the disposing locations of the curved portion 610 and the bump 620 can be adjusted based on design requirements. For instance, in the embodiment illustrated in FIG. 3B, the curved portion 610 is disposed on the first pivot 611 while the bump 620 is disposed on the first end portion 3131 of the first connector 313. Specifically, the first end portion 3131 of the first connector 313 is disposed with the bump 620 extending into the curved portion 610, wherein the bump 620 moves within the curved portion 610 as the support 300 rotates with respect to the body 100. As such, the curved portion 610 can limit the displacement of the bump 620 when the first pivot 311 rotates, so that the rotation angle of the support 300 relative to the body 100 can be limited.

Figure 3C:
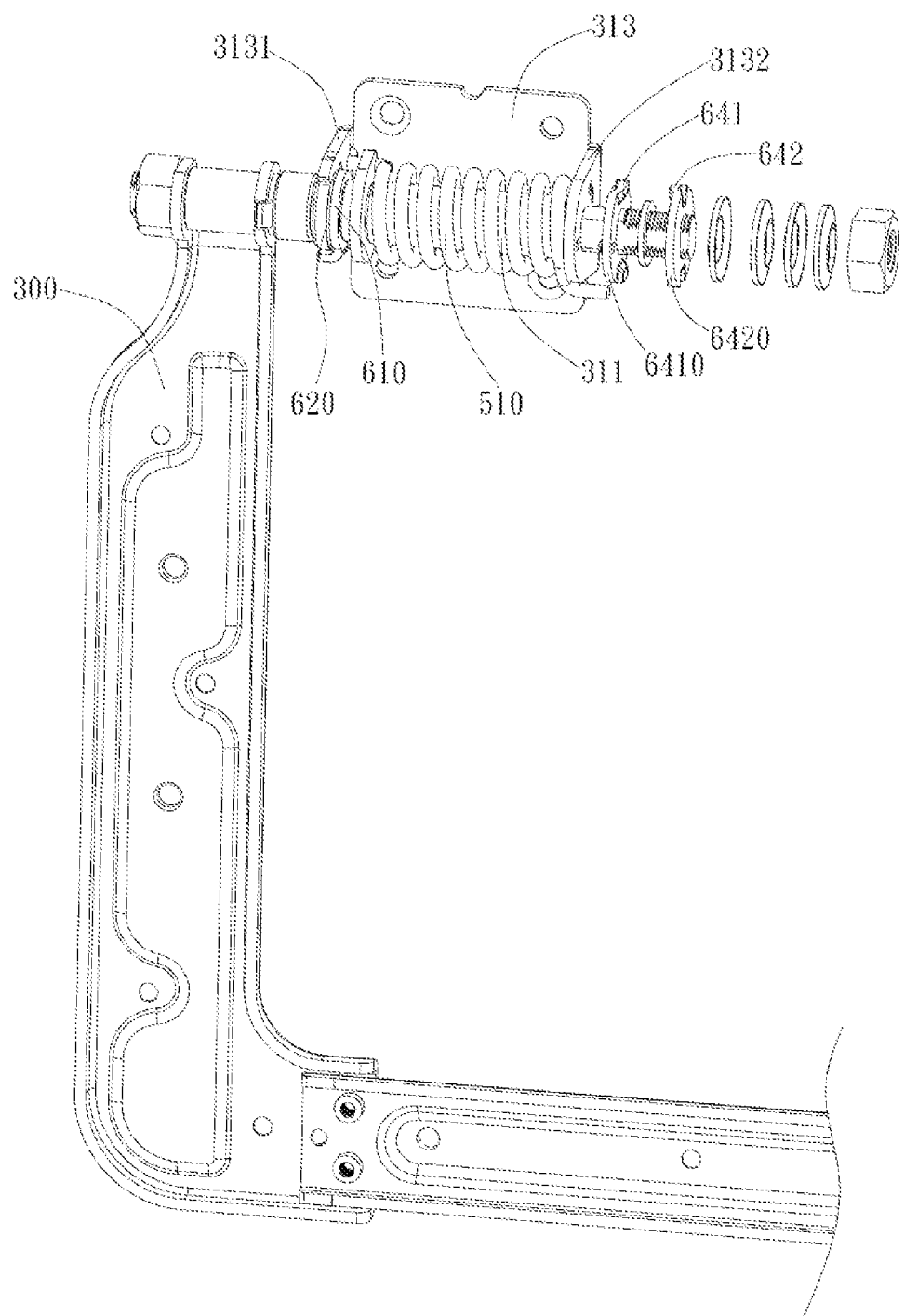
FIG. 3C is a schematic view of the display device having a first positioning point and a second positioning point in one embodiment of the present invention.

As FIG. 3A and FIG. 3C show, in a more preferred embodiment, a second end portion 3132 of the first connector 313 has a first positioning point 641 and the first pivot 311 passes through the second end portion 3132 of the first connector 313. The first pivot 611 has a second positioning point 642, wherein the support 300 and the body 100 illustrated in FIG. 1 are substantially parallel with each other and in a storage state when the first positioning point 641 contacts the second positioning point 642. Furthermore, the first positioning point 641 and the second positioning point 642 are preferably bulges protruding toward each other respectively from a first curved plate 6410 and a second curved plate 6420. The first curved plate 6410 is fixed at the second end portion 3132 and the second curved plate 6420 is coupled with a non-circular portion of the first pivot 311 by its non-circular centre through hole in order to link with the first pivot 311. When the first positioning point 641 and the second positioning point 642 directly contact each other and together press the first curved plate 6410 and the second curved plate 6420 into deformation, the support 300 and the body 100 are substantially parallel with each other in the storage state such as illustrated in FIG. 2A. When one end of the support 300 is pulled away from the body 100 into the working state as illustrated in FIG. 2B, the first positioning point 641 and the second positioning point 642 are detached so that the first curved plate 6410 and the second curved plate 6420 are not subject to deformation. In a more preferred embodiment, in order to make the support 300 and the body 100 become parallel with each other for storage of the display device 900, the user must apply a force larger than the elastic force of the first elastic unit 510 so that the first positioning point 641 and the second positioning point 642 can directly contact each other. This prevents the support 300 from unexpectedly leaving the working surface 800 to become parallel with the body 100 due to the elastic force of the first elastic unit 510 and thus prevents the display device 900 from falling down because of the lack of support.

In the preferred embodiment illustrated in FIG. 1, the display device 900 further includes a second elastic device 520 while the support 300 further includes a second pivot 221 and a second connector 323. The second elastic device 520 is connected to the second pivot 321 and the second connector 323, wherein the second connector 323 is fixed on the back side of the body 100. The second elastic unit 520 is connected to the second pivot 321 and the second connector 323 in the same manner as the first elastic unit 510 connected to the first pivot 311 and the first connector 313, and thus is not elaborated here. The first elastic unit 510 and the second elastic unit 520 together generate a restoring force to pull the support 300 toward the body 100 (as shown in FIG. 2A) when the first slip stopper 210 moves away from the working surface 800 (as shown in FIG. 2C). In this preferred embodiment, the support 300 is a U-shaped support 300, wherein the first pivot 311 and the first connector 313 are disposed at one end of the U-shaped support 300. On the other hand, the second pivot 321 and the second connector 323 are disposed at the other end of the U-shaped support 300.

Furthermore, the present invention is achieved using two pivots (311, 321), two connectors (313, 323), and two elastic unit (510, 520). However, it should be noted that the present invention can also be achieved by using one pivot, one connector, and one elastic unit.

Figure 4A:
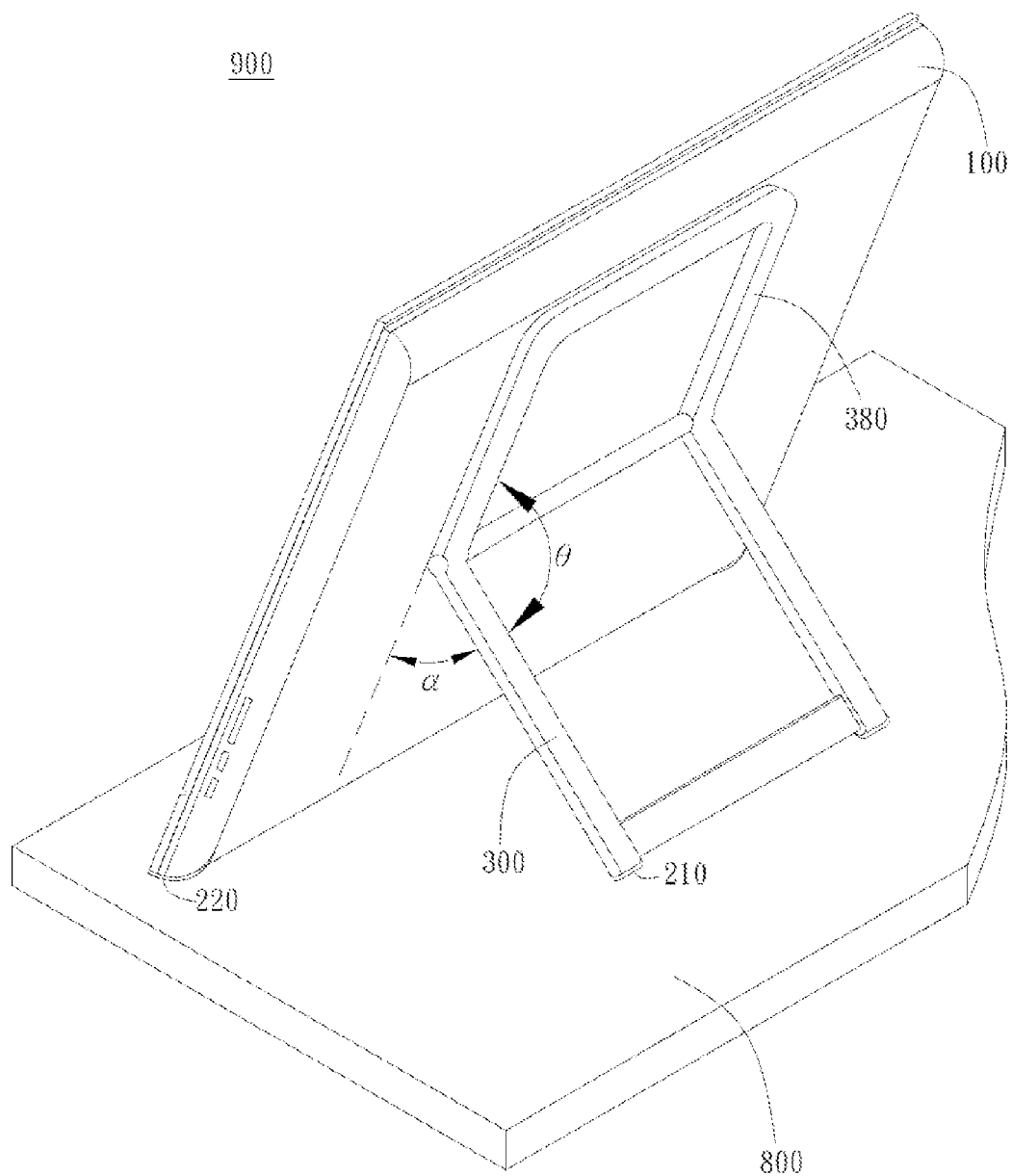
FIGS. 4A to 5B are schematic views of the display device having an extending support in different embodiments of the present invention.
Figure 4B:
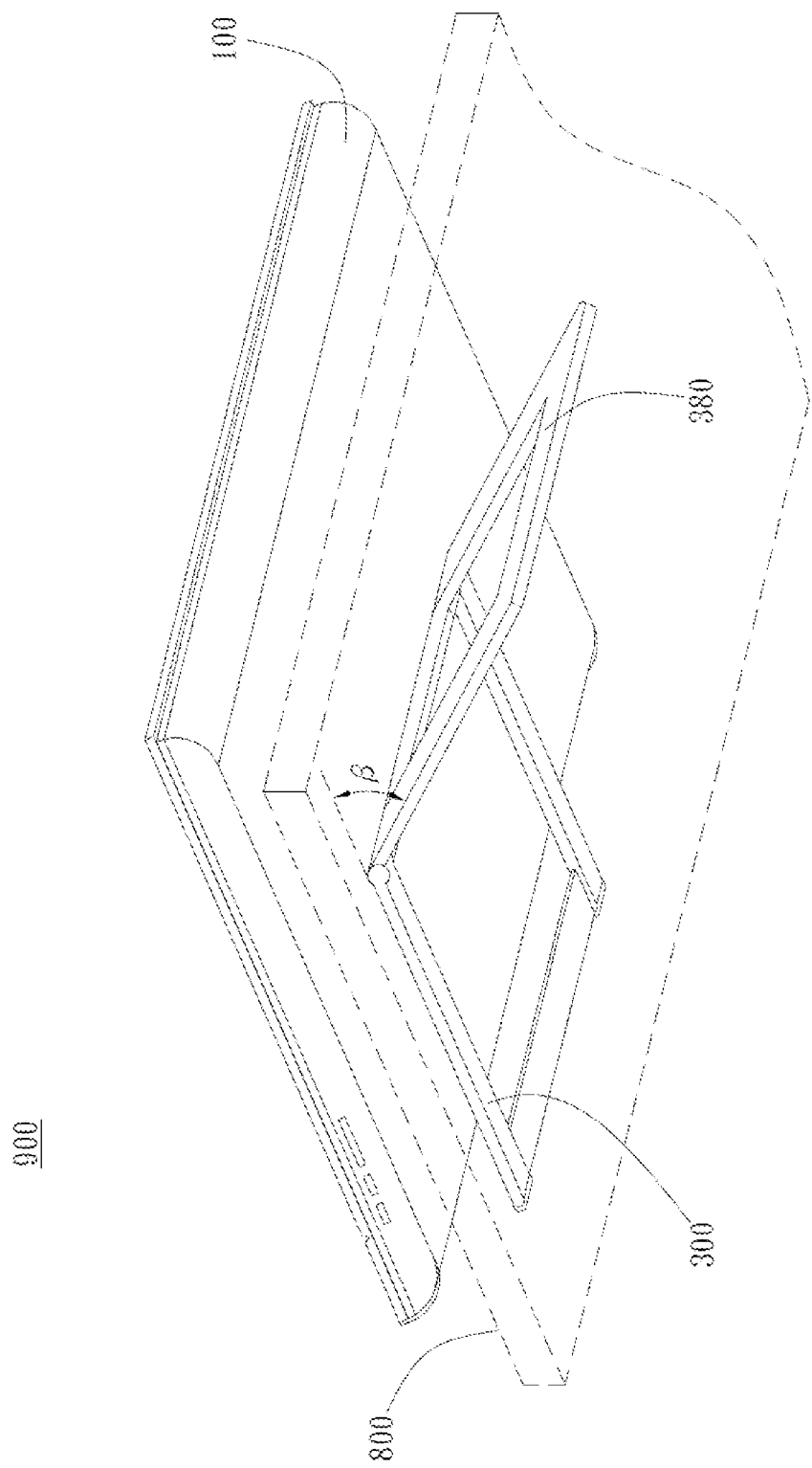

As FIG. 4A and FIG. 4B show, in different embodiments, the display device 900 further includes an extending support 380 disposed on the back side of the body 100 opposite to the support 300, wherein an angle θ is included between the extending support 380 and the support 300. The extending support 380 cannot rotate with respect to the support 300, i.e. the angle θ between the support 300 and the extending support 380 remains constant. A first angle α is included between the body 100 and the support 300 when the body 100 and the support 300 are supported on the working surface 800 as illustrated in FIG. 4A. A second angle β is included between the body 100 and the extending support 380 when the body 100 and the extending support 380 are supported on the working surface 800, wherein the second angle β is greater than the first angle α. Specifically, the relative position of the support 300 and the extending support 380 is fixed by the angle θ. The extending support 380 and the support 300 together can rotate with respect to the body 100. The support 300 and the extending support 380 together can be used to support the body 100 on the working surface 800 when the display device 900 is tilted at a large angle as illustrated in FIG. 4B. That is, the extending support 380 is used when the display device 900 is tilted at a large angle, but the tilt angle provided by the extending support 380 cannot be adjusted. The support 300 is mainly used when the display device 900 is tilted at a small angle. In this way, the first elastic unit 510 and the second elastic unit 520 does not need to have great elasticity and this reduces the material costs of making the first elastic unit 510 and the second elastic unit 520. Moreover, the extending support has a frame like structure, increasing the feasibility of grapping the display device 900.

Figure 2E:
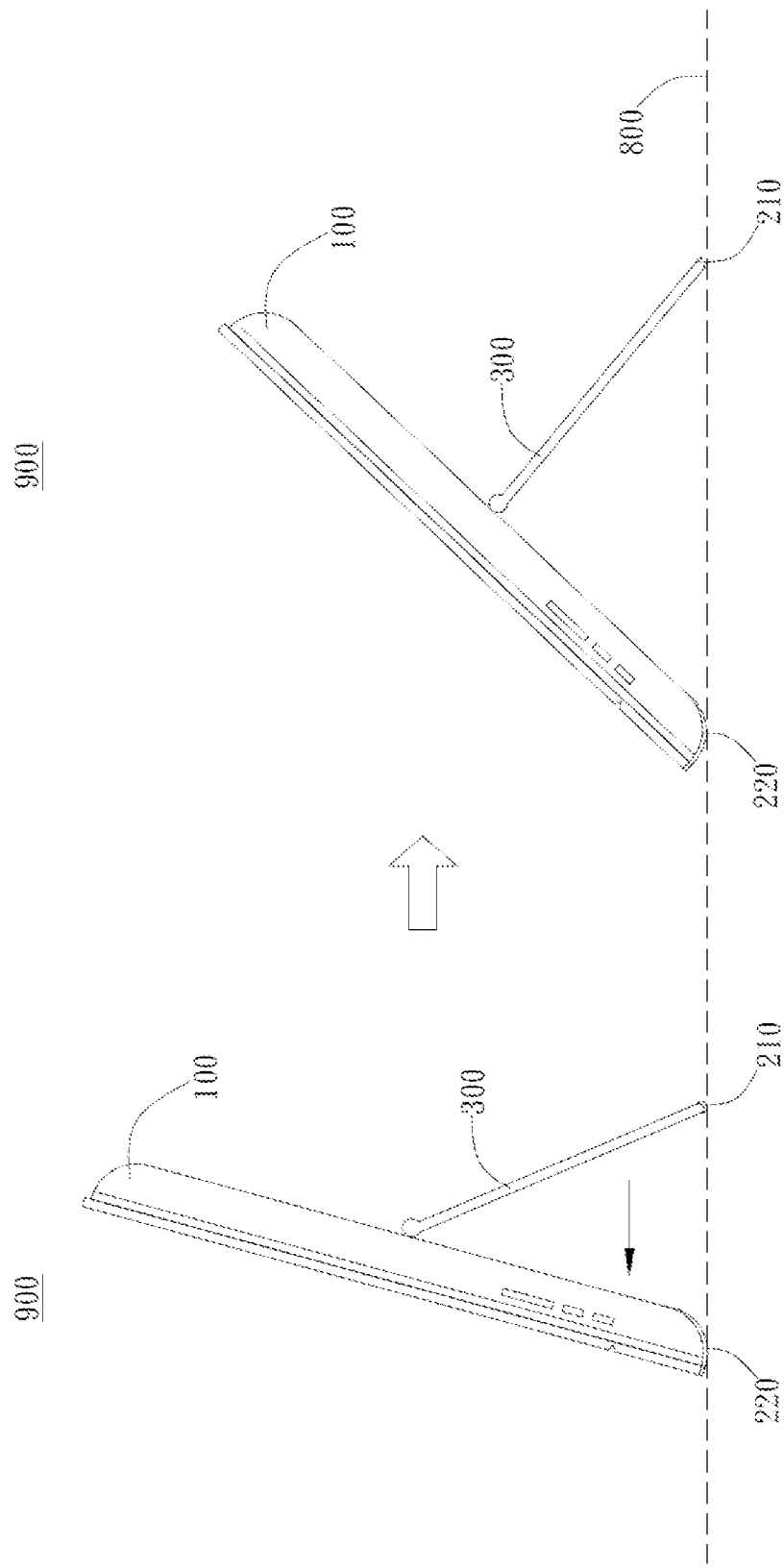
Figure 5A:
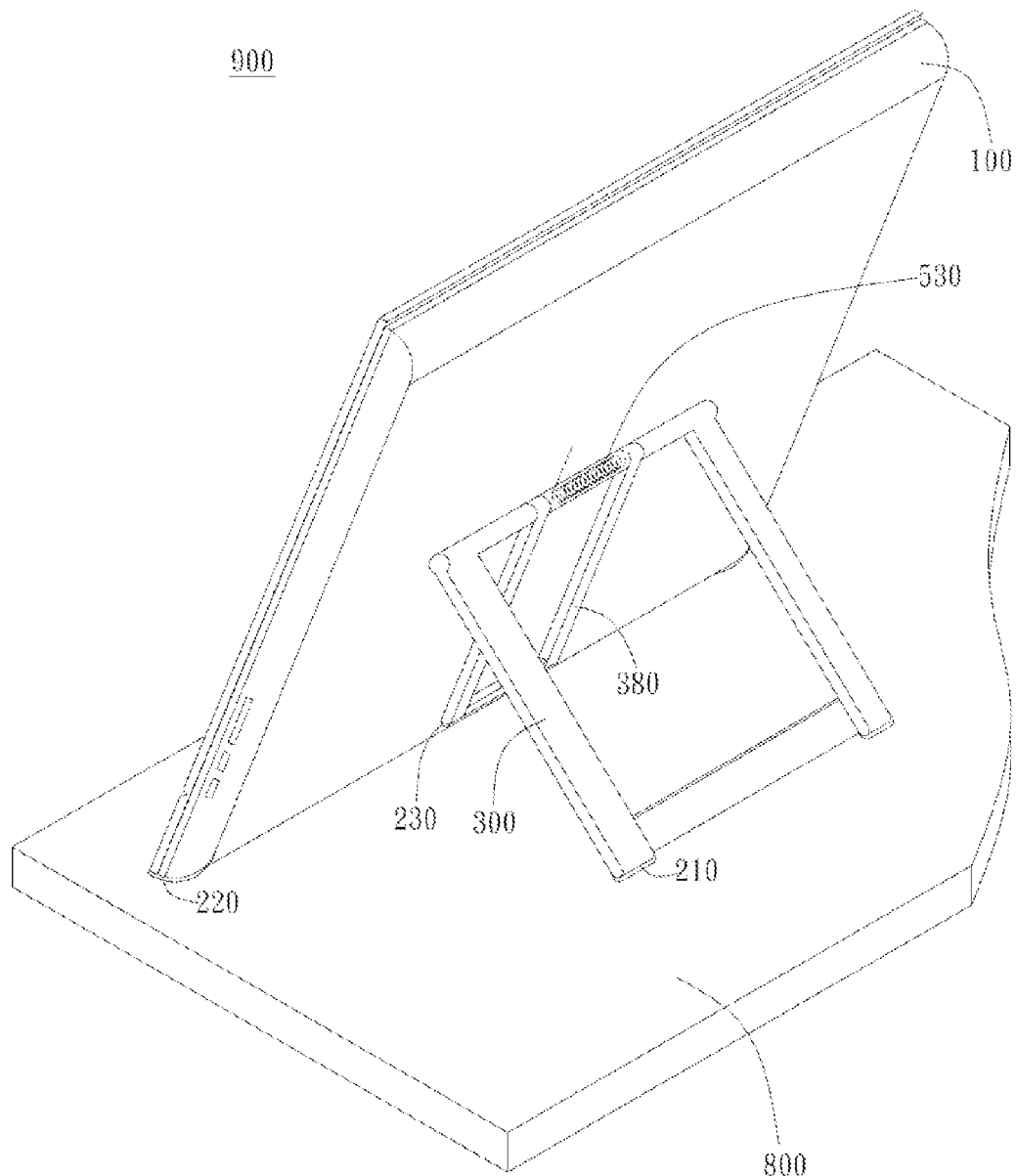
Figure 5B:
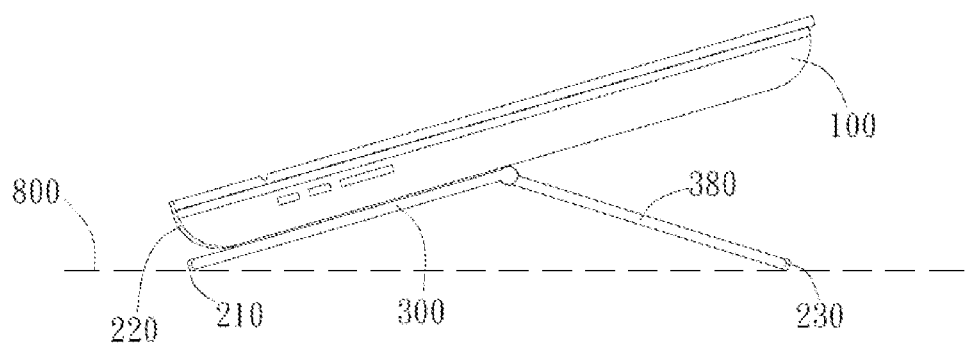

As FIG. 5A and FIG. 5B show, in different embodiments, the display device 900 further includes an extending support 380 and a third elastic unit 530, wherein the third elastic unit 530 of the present embodiment can also be referred to as an extending support elastic unit 530. The extending support 380 can be rotatably disposed on the back side of the body 100 and the bottom of the extending support 380 is disposed with a third slip stopper 230, wherein the third slip stopper 230 of the present embodiment can also be referred to as an extending support slip stopper 230. The third elastic unit 530 is pivotally connected to the body 100 and the extending support 380, wherein the structure of the third elastic unit 530 is similar to that of the first elastic unit 510 and therefore is not elaborated here. The display device 900 is supported on the working surface 800 by the bottom of the body 100 and the third slip stopper 230 (see FIG. 5B), wherein the third elastic unit 530 can generate a restoring force to pull the extending support 380 toward the body 100 when the third slip stopper 230 moves away from the working surface 800. Specifically, in the present embodiment, the third elastic unit 530 of the extending support 380 has greater elasticity and uses tighter springs whereas the first elastic unit 510 and the second elastic unit 520 of the support 300 have less elasticity and use looser springs. When the display device 900 is tilted at a small angle as illustrated in FIG. 5A such that the angle between the body 100 and a virtual surface perpendicular to the working surface 800 is approximately 10° to 50°, the support 300 can be used to support the body 100 and achieve the function illustrated in FIGS. 2D and 2E. When the display device 900 is tilted at a larger angle as illustrated in FIG. 5B such that the angle between the body 100 and a virtual surface perpendicular to the working surface 800 is approximately 70° to 80°, the support 300 can retreat to become substantially parallel with the body 100 and the extending support 380 can be used to support the body 100 and achieve the function as illustrated in FIGS. 2D and 2E. In other words, the support 300 is used when the display device 900 is tilted at a small angle and the extending support 380 is used when the display device 900 is tilted at a large angle. This avoid the elastic fatigue in the first elastic unit 510 and the second elastic unit 520 when the support 300 is used to support the display device 900 tilted at a large angle for a long time.

The above is a detailed description of the particular embodiment of the invention which is not intended to limit the invention to the embodiment described. It is recognized that modifications within the scope of the invention will occur to a person skilled in the art. Such modifications and equivalents of the invention are intended for inclusion within the scope of this invention.

What is claimed is:

1. A display device, used on a working surface, comprising:
   a body;
   a support rotatably disposed on a back side of the body, the support comprising a first slip stopper;
   a first elastic unit pivotally connected to the body and the support; and
   an extending support disposed on the back side of the body opposite to the support and inrotatably with respect to the support, an angle is included between the extending support and the support, wherein a first angle is included between the body and the support when the body and the support are supported on the working surface, a second angle is included between the body and the extending support when the body and the extending support are supported on the working surface, the second angle is greater than the first angle;
   wherein the display device is supported on the working surface by a bottom of the body and the first slip stopper, the first elastic unit generates an elastic force to pull the support toward the body when the first slip stopper moves away from the working surface.

2. The display device of claim 1, wherein the support further comprises a first pivot and a first connector, the first elastic unit is pivotally connected to the first pivot and the first connector, the first connector is fixed on the back side of the body.

3. The display device of claim 2, wherein an end portion of the first connector is disposed corresponding to the first pivot and comprises a curved portion, the first pivot comprises a bump, the curved portion limits a displacement of the bump when the first pivot rotates.

4. The display device of claim 2, wherein an end portion of the first connector is disposed corresponding to the first pivot and comprises a bump, the first pivot comprises a curved portion, the curved portion limits the displacement of the bump when the first pivot rotates.

5. The display device of claim 2, wherein an end portion of the first connector is disposed corresponding to the first pivot and comprises a first positioning point, the first pivot comprises a second positioning point, and the support and the body are parallel with each other in a storage state when the first positioning point contacts the second positioning point.

6. The display device of claim 2, wherein the display device further comprises a second elastic unit, the support further comprises a second pivot and a second connector, the second elastic unit is pivotally connected to the second pivot and the second connector, the second connector is fixed on the back side of the body, wherein the first elastic unit and the second elastic unit together generate the elastic force to pull the support toward the body when the first slip stopper moves away from the working surface.

7. The display device of claim 6, wherein the support is a U-shaped support, the first pivot and the first connector are disposed at one end of the U-shaped support while the second pivot and the second connector are disposed at the other end of the U-shaped support.

8. The display device of claim 1, wherein the body further comprises a second slip stopper disposed on a bottom of the body, an angle is included between the body and the support when the display device is supported on the working surface by the bottom of the body and the first slip stopper, the angle is between 60° and 130°.

9. A display device, comprising:
   a body;
   a support rotatably disposed on a back side of the body;
   a first elastic unit pivotally connected to the body and the support; and
   an extending support rotatably disposed on the back side of the body and opposite to the support, an angle being included between the extending support and the support;
   wherein a first angle is included between the body and the support when the body and the support are supported on a working surface, a second angle is included between the body and the extending support when the body and the extending support are supported on the working surface, the second angle is greater than the first angle;
   wherein the support comprises a first slip stopper, the display device is supported on the working surface by a bottom of the body and the first slip stopper, the first elastic unit generates an elastic force to pull the support toward the body when the first slip stopper moves away from the working surface.

10. The display device of claim 9, wherein the body further comprises a second slip stopper disposed at a bottom of the body.

11. The display device of claim 9, wherein the support further comprises a first pivot and a first connector, the first elastic unit is pivotally connected to the first pivot and the first connector, the first connector is fixed on the back side of the body.

12. The display device of claim 11, wherein an end portion of the first connector is disposed corresponding to the first pivot and comprises a curved portion, the first pivot comprises a bump, the curved portion limits a displacement of the bump when the first pivot rotates.

13. The display device of claim 9, wherein the display device further comprises a third elastic unit, the extending support is rotatably disposed on the back side of the body and a third slip stopper is disposed at a bottom of the extending support, the third elastic unit is pivotally connected to the body and the extending support, wherein the display device is supported on the working surface by a bottom of the body and the third slip stopper, the third elastic unit generates an elastic force to pull the extending support toward the body when the third slip stopper moves away from the working surface.

* * * * *